(12) United States Patent
Wu

(10) Patent No.: US 6,661,087 B2
(45) Date of Patent: Dec. 9, 2003

(54) LEAD FRAME AND FLIP CHIP SEMICONDUCTOR PACKAGE WITH THE SAME

(75) Inventor: Chi-Chuan Wu, Taichung (TW)

(73) Assignee: Siliconware Precision Industries Co., Ltd. (TW)

( * ) Notice: Subject to any disclaimer, the term of this patent is extended or adjusted under 35 U.S.C. 154(b) by 0 days.

(21) Appl. No.: 09/973,358

(22) Filed: Oct. 9, 2001

(65) Prior Publication Data
US 2003/0067057 A1 Apr. 10, 2003

(51) Int. Cl.[7] .......................... H01L 23/48; H01L 23/06
(52) U.S. Cl. ................. 257/692; 257/684; 257/737; 257/738; 257/673; 257/778; 257/666
(58) Field of Search ................. 257/737–738, 257/690–692, 676, 673, 778, 684, 693, 730–731, 733, 732, 669–670, 672–674, 695, 696, 666, 779, 694

(56) References Cited

U.S. PATENT DOCUMENTS 5,648,682 A * 7/1997 Nakazawa et al. ......... 257/673
5,677,567 A    10/1997 Ma et al. ................... 257/666
6,060,769 A    5/2000  Wark ......................... 257/666
6,208,020 B1 * 3/2001  Minamio et al.

* cited by examiner

Primary Examiner—Long Pham
Assistant Examiner—Dilinh Nguyen
(74) Attorney, Agent, or Firm—Peter F. Corless; Steven M. Jensen; Edwards & Angell, LLP

(57) ABSTRACT

A lead frame and a flip chip semiconductor package having the lead frame are proposed, in which a die pad of the lead frame is elevated with a height difference relative to leads of the lead frame, and the height difference cannot exceed the vertical height of a plurality of solder bumps, which electrically connect a semiconductor chip to the lead frame. In a reflow process, due to good wetability of the lead frame, the solder bumps keep collapsing, allowing the semiconductor chip placed above the die pad to gradually move downwardly until abutting the die pad, which then stops the chip from moving, so as to force the solder bumps to stop collapsing to be maintained with a certain height. This therefore helps eliminate the occurrence of over-collapsing of the solder bumps, and thus assure bonding quality between the solder bumps and the lead frame.

14 Claims, 4 Drawing Sheets

LEAD FRAME AND FLIP CHIP SEMICONDUCTOR PACKAGE WITH THE SAME

FIELD OF THE INVENTION

The present invention relates to semiconductor packages, and more particularly to a semiconductor package, in which a semiconductor chip is mounted in a flip chip manner on a lead frame.

BACKGROUND OF THE INVENTION

A semiconductor device tends to be made in low cost, high performance and high integration, and is also preferably dimensioned with reduction in size and overall thickness thereof, in correspondence to a trend of low-profile electronic products. A QFN (quad-flat non-leaded) semiconductor package is a mainstream conventional product, due to advantages in that the QFN semiconductor package is only slightly larger in dimension than a semiconductor chip mounted therein, and is cost-effectively made in a lead frame based batch manner.

For fabricating such a QFN semiconductor package, generally it is first to mount at least one semiconductor chip on a lead frame having a die pad and a plurality of leads; then, a plurality of gold wires are bonded for electrically connecting the chip and the leads; and finally, an encapsulant is formed to encapsulate the chip. However, in the wire bonding process, due to dense distribution of the leads or complicated layout of the chip, wire loops of the gold wires are interlaced, and thus electric interference occurs if the adjacent gold wires are not properly spaced from each other. Moreover, during the formation of the encapsulating, the gold wires with relatively longer wire loops usually cannot sustain impact from mold flow, and therefore encounter problems such as wire sweep or even short circuit if coming into contact with one another.

In addition, with the development in fabrication for a flip chip semiconductor package, a technique of reflowing solder bumps onto bonding pads for establishing electrical connection is getting more commonly used. Comparing to the conventional wire bonding process, the implantation of the solder bumps is implemented by using a one-step and self-alignment process, and thus is more cost-effective and less time-consuming. Accordingly, U.S. Pat. No. 5,677,567 titled as "Leads Between Chips Assembly" discloses a flip chip on lead frame technology. As shown in FIG. 5, a semiconductor device 4 comprises a lead frame (not shown), which is made of a metallic material such as copper, and mainly consists of a plurality of leads 42 variable in length; a plurality of semiconductor chips 43 each having an active surface 430 disposed with a plurality of bonding pads thereon, and a non-active surface 431; a plurality of solder bumps 44 implanted on the bonding pads 432, allowing the leads 42 to be reflowed on each of front and back surfaces thereof with one of the chips 43 in a manner that the active surface 430 of the chip 43 faces the leads 42; and an encapsulant 45 formed on the leads 42 for encapsulating the semiconductor chips 43.

This technology is therefore characterized in that the semiconductor chip 43 is bonded and electrically connected to the corresponding leads 42 in a flip-chip manner. The solder bumps 44 are made of tin/lead alloy (generally in composition of tin 63/lead 37 alloy which gives a soft characteristic). As such, during the reflow process, as temperature raises to a certain degree, the solder bumps 44 collapse to become instantly eutectic with contact regions 421 of the leads 42. This therefore makes an intermetallic compound layer (not shown) formed between the solder bumps 44 and the contact regions 421, in an effort to firmly reinforce the bonding between the solder bumps 44 and the leads 42. The formation of the intermetallic compound is called a wetting process. However, due to good wetability of the copper-made lead frame (not shown), after the solder bumps 44 are bonded to predetermined positions (i.e. the contact regions 421) on the leads 42 of the lead frame, the solder bumps 44 still keep collapsing and extending outwardly to be spread on the leads 42, as illustrated in FIG. 6. This over-collapsing of the solder bumps 44 increases in brittleness of the bonding between the solder bumps 44 and the leads 42, thereby easily resulting in bonding structural cracking or even loss of electrical properties. Further, the excessively deformed solder bumps 44 also lead to significantly decrease in the height difference between the semiconductor chip and the leads, and this detrimentally affects the implementation of subsequent processes in fabrication.

In order to solve the above-described problems, as shown in FIG. 7, U.S. Pat. No. 6,060,769 titled as "Flip Chip on Leads Device" discloses a technology of forming a solder mask 47 on predetermined positions of the leads 42, wherein the solder mask 47 has at least one opening 470 with predetermined size for bonding the solder bumps 44 thereto. This technology in essence is to utilize the opening size S of the solder mask 47 for controlling the collapse degree of the solder bumps 44. As the size S of the opening 470 increases, the solder bumps 44 can extend outwardly to a greater extent; that is, the larger the collapse degree, the smaller the vertical height h of the solder bumps 44 correspondingly. Therefore, with the control in the collapse degree of the solder bumps 44, the height difference between the semiconductor chip 43 and the leads 42 can be predetermined, thus eliminating the occurrence of the over-collapsing of the solder bumps 44.

However, the formation of the solder mask on the lead frame employs such as screen printing or photo-lithographic patterning processes, which are quite complex and ineffective in cost, therefore making it difficult to widely implement in practice. In the case of the solder bumps being alternatively made of e.g. tin 5/lead 95 alloy for raising a melting point thereof, allowing the over-collapsing of the solder bumps to be prevented from occurrence, however, such solder bumps generally doubles up the manufacturing cost thereof

SUMMARY OF THE INVENTION

A primary objective of the present invention is to provide a lead frame and a semiconductor package with the lead frame, in which a die pad is elevated in position with a proper height difference relative to leads, so as to prevent solder bumps from over-collapsing in a die bonding process, and thus assure bonding reliability of the solder bumps in the semiconductor package.

Another objective of the invention is to provide a lead frame and a semiconductor package with the lead frame, in which a lead frame good in heat dissipation is employed, allowing heat generated from a semiconductor chip to be quickly dissipated through a die pad of the lead frame after the semiconductor chip is attached to the die pad, so as to improve overall heat dissipating efficiency of the semiconductor package.

In accordance with the foregoing and other objectives, a semiconductor package proposed in the present invention comprises: a lead frame made of metal such as copper, and having a die pad and a plurality of leads, wherein the die pad is higher in elevation than the leads, and a height difference formed between the die pad and the leads does not exceed a height of a plurality of solder bumps, and further a plurality of contact portions are pre-defined on the leads for bonding the corresponding solder bumps thereto; a non-conductive thermal adhesive applied on a top surface of the die pad, for adhering a semiconductor chip to the die pad; at least one semiconductor chip attached in a flip chip manner to the contact portions of the leads via the solder bumps; and an encapsulant for encapsulating the semiconductor chip on the lead frame.

In a reflow process for heating the foregoing semiconductor package to a certain temperature, the soft solder bumps having a low melting point start to melt and collapse. Due to good wetability of the copper-made lead frame, the solder bumps keep collapsing, making the semiconductor chip move downwardly due to gravity of its weight. When the semiconductor chip descends in elevation to abut the non-conductive thermal adhesive, the die pad stops the chip from moving, thereby forcing the solder bumps to stop collapsing to be maintained with a certain height.

With the provision of the height difference between the die pad and the leads for controlling collapse degree of the solder bumps, it is also beneficial for implementing subsequent processes since the chip is properly spaced from the leads. Moreover, as the die pad functions to restrain the solder bumps from keeping collapsing, it eliminates the occurrence of over-collapsing of the solder bumps and bonding brittleness between the solder bumps and the lead frame, so that structural strength and electrical properties can be assured in the semiconductor package.

BRIEF DESCRIPTION OF THE DRAWINGS

The present invention can be more fully understood by reading the following detailed description of the preferred embodiments, with reference made to the accompanying drawings, wherein.

DETAILED DESCRIPTION OF THE PREFERRED EMBODIMENTS

Three preferred embodiments of the semiconductor package of the invention are fully described with reference to FIGS. 1–4 as follows. In particular, a QFN semiconductor package is exemplified herewith for its practicality in which a die pad is electrically connected directly to external devices.

First Preferred Embodiment

Figure 1:
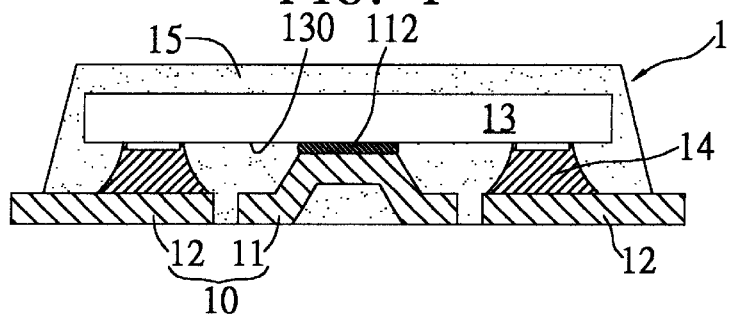
FIG. 1 is a sectional view of a QFN semiconductor package of a first preferred embodiment of the invention.

As shown in FIG. 1, a semiconductor package 1 of a first embodiment of the invention comprises: a lead frame 10 having a die pad 11 and a plurality of leads 12 surrounding the die pad 11, wherein the die pad 11 is elevated in position with a pre-determined height difference relative to than the leads 12; at least one semiconductor chip 13 mounted on the leads 12 via a plurality of solder bumps 14 in a manner that an active surface 130 of the semiconductor chip 13 faces towards the die pad 11; a non-conductive thermal adhesive 112 applied on the die pad 11 for adhering the semiconductor chip 13 to the die pad 11; and an encapsulant 15 formed on the lead frame 10 for encapsulating the semiconductor chip 13.

Figure 2A:
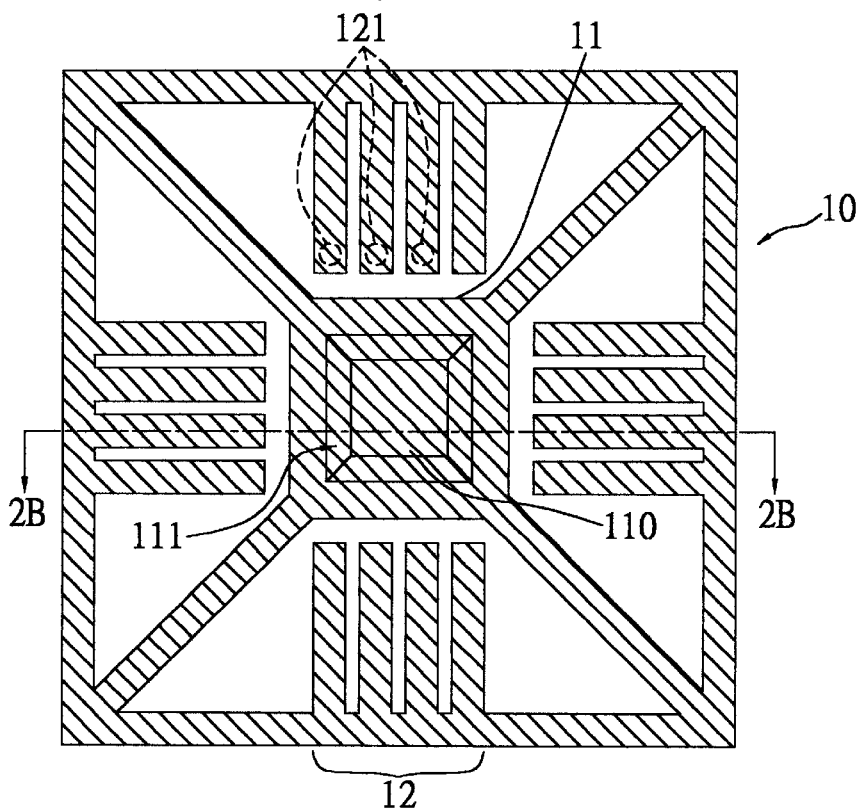
FIG. 2A is a top view of a lead frame used in a semiconductor package of a first preferred embodiment of the invention.
Figure 2B:
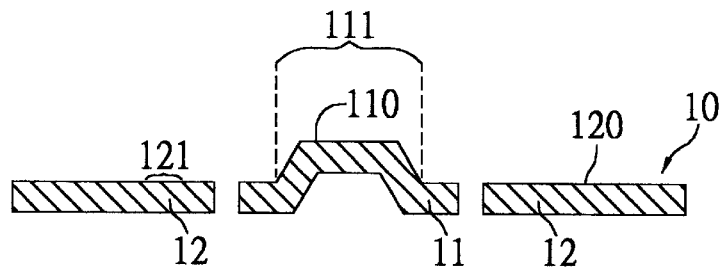
FIG. 2B is a sectional schematic view of FIG. 2A cutting along a line 2B—2B.

Referring to FIG. 2A (top view) and FIG. 2B (sectional view), the lead frame 10 comprises the die pad 11 and the plurality of leads 12 surrounding the die pad 11, wherein the die pad 11 has a chip carrying surface 110, and the leads 12 have a lead top surface 120. The lead frame 10 is made of a metallic material such as copper or iron/nickel alloy. By using a conventional punching method, the die pad 11 is punched at a central position to form a protruding portion 111 having a height higher than the leads 12, wherein the chip carrying surface 110 of the protruding portion 111 is spaced from the lead top surface 120 by a height difference not exceeding the original height of the solder bumps (not shown) prior to being reflowed, but designed according to predetermined collapse degree of the solder bumps.

Moreover, on the lead top surface 120 there is further defined at least one contact portion 121 for bonding the corresponding solder bumps (not shown) thereto. Since the copper-made leads 12 are good in solderability and wetability, thus an additional layer of silver, nickel or the like is not necessarily plated on the contact portion 121. After the lead frame 10 is completely fabricated, a non-conductive thermal adhesive (designated by a reference numeral 112 shown in FIG. 2C) is applied on the chip carrying surface 110 of the protruding portion 111 of the die pad 11, and a flip-chip process can then be performed.

Figure 2C:
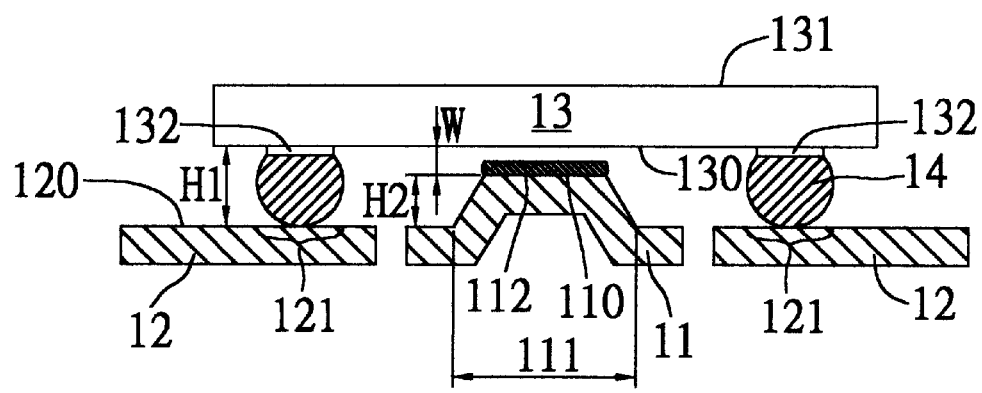
FIGS. 2C–2D are schematic diagrams depicting the fabrication of a semiconductor package of a first preferred embodiment of the invention.

As shown in FIG. 2C, the semiconductor chip 13 has an active surface 130 disposed with a plurality of electronic circuits and electronic components thereon, and an opposing non-active surface 131, wherein a plurality of bonding pads 132 are formed on the active surface 130 for bonding the plurality of solder bumps 14 thereto, which are made of soft metallic solder such as tin 63/lead 37 alloy having a low melting point. Then, the semiconductor chip 13 implanted with the solder bumps 14 thereon is mounted on the lead top surface 120 in a manner that, the active surface 130 of the semiconductor chip 13 faces towards the die pad 11, and each of the solder bumps 14 is attached to the corresponding contact portion 121. Since the protruding height H2 of the protruding portion 111 of the die pad 11 is smaller than the vertical height H1 of the solder bumps 14, thus a cavity W is formed between the semiconductor chip 13 and the protruding portion 111 of the die pad 11. As such, the semiconductor chip 13 is substantially suspended above the non-conductive thermal adhesive 112 prior to performing a reflow process.

Figure 2D:
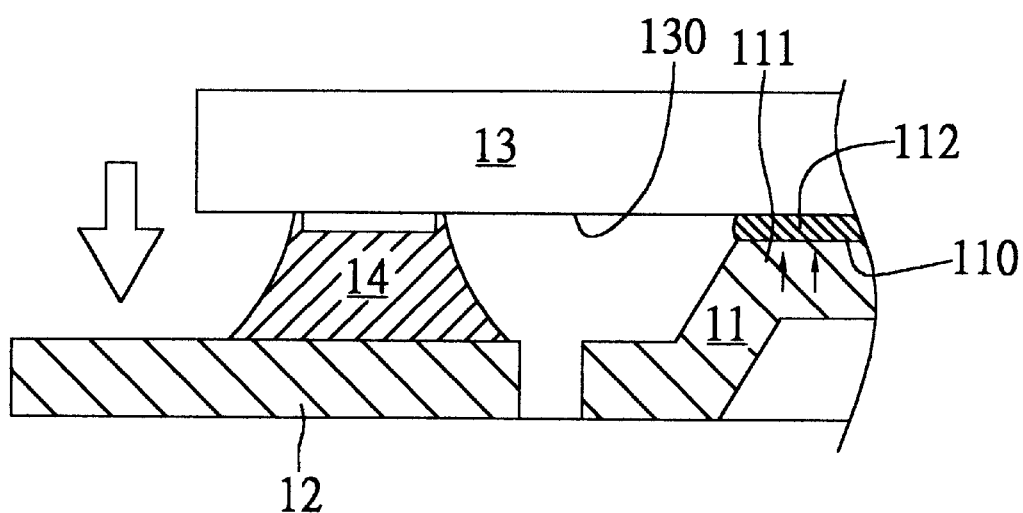

However, after temperature raises to a certain degree during the reflow process, as shown in FIG. 2D, the soft solder bumps 14 having a low melting point start to melt and collapse, and the semiconductor chip 13 gradually move downwardly due to gravity of its weight. Further, due to the good wetability of the leads 12, the solder bumps 14 can keep collapsing, making the chip 13 continuously move downwardly until coming into contact with the non-conductive thermal adhesive 112. At this time, the chip 13 is impeded to further move downwardly by the protruding portion 111 of the die pad 11, thereby forcing the solder bumps 14 to stop collapsing to be maintained with a certain height. Therefore, the chip 13 can be spaced from the leads 12 by a proper distance without detrimentally affecting subsequent processes in fabrication, and the bonding between the solder bumps 14 and the leads 12 can be assured in strength without becoming brittle due to over-collapsing of the solder bumps 14.

In addition, as a QFN semiconductor package is exemplified in this embodiment of the invention, after completing the reflow process, the semiconductor chip 13 is attached to the chip carrying surface 110 of the die pad 11 via the non-conductive thermal adhesive 112, and heat generated in operation of the chip 13 can be dissipated quickly through the die pad 11 good in thermal conductivity. This therefore helps improve heat dissipation for the semiconductor package and maintain the chip performance.

Second Preferred Embodiment

Figure 3A:
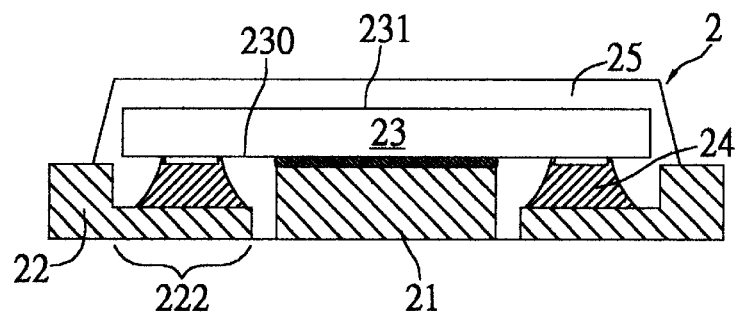
FIG. 3A is a sectional view of a QFN semiconductor package of a second preferred embodiment of the invention.
Figure 3B:
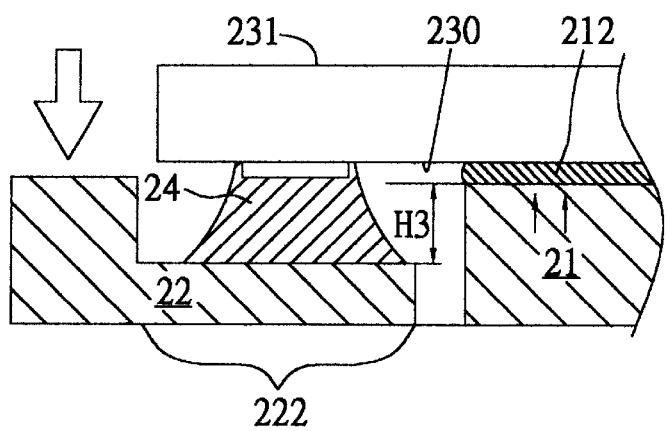
FIG. 3B is a partially magnified view of a semiconductor package of a second preferred embodiment of the invention.

In the foregoing first embodiment, a die pad of a lead frame is formed with a protruding portion by using a punching method. Alternatively, as shown in FIG. 3A, in a semiconductor package 2 of this embodiment, leads 22 of a lead frame can be processed in a half-etching manner to form a plurality of contact portions 222 thereon, allowing solder bumps 24 to be implanted on the contact portions 222, wherein the contact portions 222 are dimensioned in depth according to predetermined collapse degree of the solder bumps 24. In a reflow process, as shown in FIG. 3B, the solder bumps 24 melt and collapse, making a semiconductor chip 23 move downwardly; as an active surface 230 of the semiconductor chip 23 abuts a non-conductive thermal adhesive 212, the chip 23 is stopped from moving by a die pad 21. Thus, in the use of the half-etching process, an appropriate height difference H3 formed between the die pad 21 and the contact portions 222 can function the same as the protruding portion of the die pad depicted in the foregoing first embodiment, so that collapsing of the solder bumps can be effectively controlled.

Third Preferred Embodiment

Figure 4:
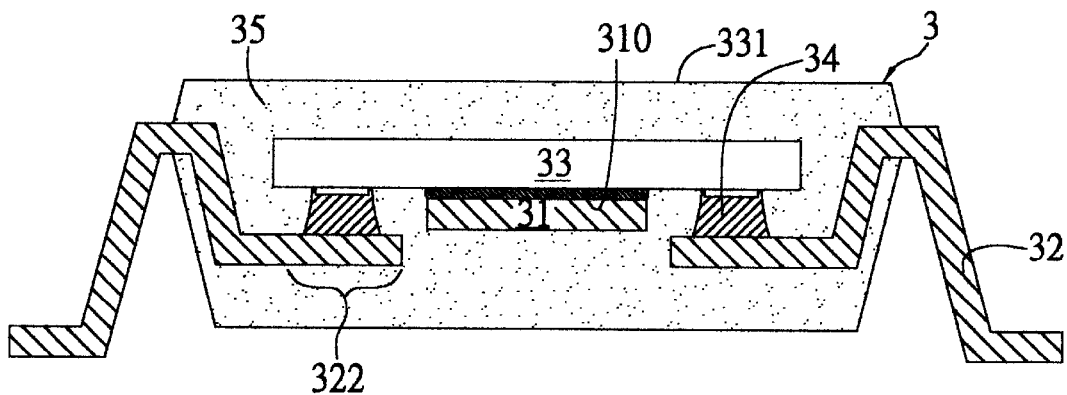
FIG. 4 is a sectional view of a semiconductor package of a third preferred embodiment of the invention.
Figure 5:
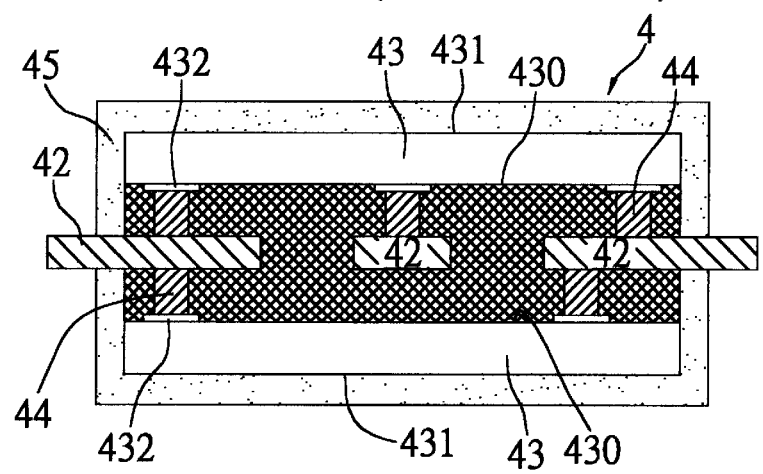
FIG. 5 (PRIOR ART) is a sectional view of a semiconductor package disclosed in U.S. Pat. No. 5,677,567.
Figure 6:
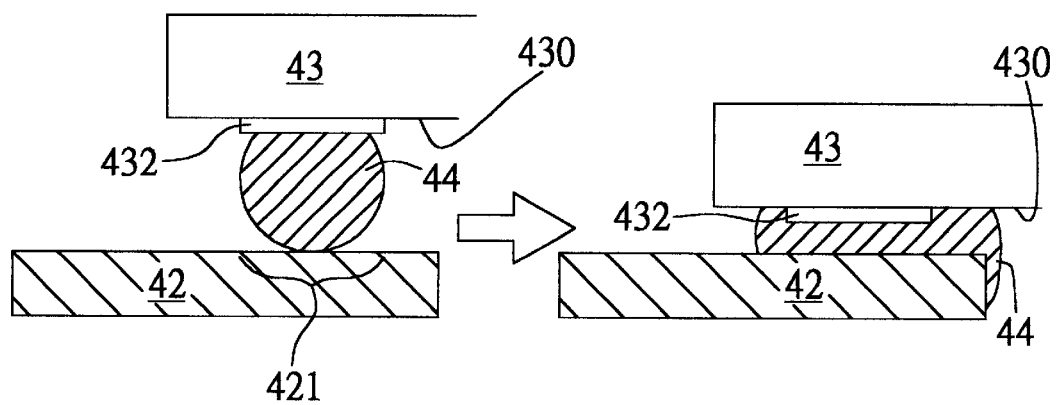
FIG. 6 (PRIOR ART) is a schematic diagram showing a process of reflowing solder bump on a conventional lead frame.
Figure 7:
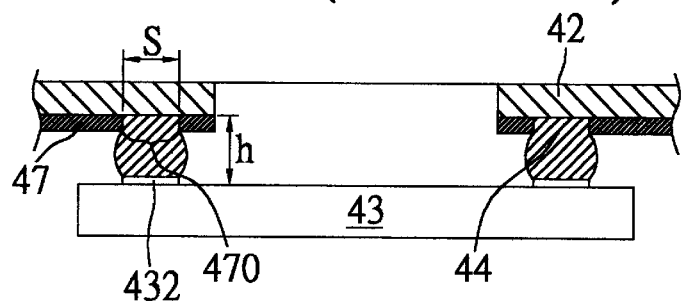
FIG. 7 (PRIOR ART) is a sectional view of a semiconductor package disclosed in U.S. Pat. No. 6,060,769.

As shown in FIG. 4, a semiconductor package 3 in a third embodiment of the invention is structurally identical to that in the foregoing first embodiment, with the only difference in a QFP (quad flat package) or TSOP (thin small outline package) is exemplified, in which a plurality of outer leads 32 in J-like or gull wing shape are formed in the semiconductor package 3. In the use of a punching method, contact portions 322 are formed downset to the leads 32, allowing a chip carrying surface 310 of a die pad 31 to be positioned with an appropriate height difference relative to the leads 32, wherein the height difference is predetermined according to collapse degree of the solder bumps 34, so as to reach the same improvements as recited in the foregoing embodiments.

The invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A flip chip semiconductor package, comprising:
    a lead frame having a die pad and a plurality of leads surrounding the die pad, wherein the die pad is formed with a protruding portion in a punching manner, making the die pad higher in elevation than the leads by a height difference corresponding to a protruded height of the protruding portion with respect to the rest of the die pad, and wherein the protruded height of the protruding portion is determined according to collapse degree of a plurality of conductive elements and corresponds to a collapsed height of the conductive elements, which electrically connect a semiconductor chip to the leads;
    at least one semiconductor chip mounted on the lead frame in a flip-chip manner so that an active surface of the semiconductor chip is attached to the protruding portion of the die pad and electrically connected to the leads by the conductive elements interposed between the active surface and the leads, wherein the conductive elements have a collapsed height corresponding to the height difference between the die pad and the leads and are received between the active surface of the semiconductor chip and the leads; and
    an encapsulant for encapsulating the semiconductor chip and the conductive elements on the lead frame.

2. The flip chip semiconductor package of claim 1, wherein the lead frame is made of a solderable metallic material.

3. The flip chip semiconductor package of claim 1, wherein the protruding portion of the die pad has a chip carrying surface with a non-conductive thermal adhesive applied thereon.

4. The flip chip semiconductor package of claim 1, wherein the conductive elements are made of soft metal with a low melting point.

5. The flip chip semiconductor package of claim 1, wherein the conductive elements are solder bumps.

6. A flip chip semiconductor package, comprising:
    a lead frame having a die pad and a plurality of leads surrounding the die pad, wherein the leads are made in a punching manner to be lower in elevation than the die pad so as to form a height difference between the die pad and the leads, and wherein the height difference is determined according to collapse degree of a plurality of conductive elements and corresponds to a collapsed height of the conductive elements, which electrically connect a semiconductor chip to the leads;
    at least one semiconductor chip mounted on the lead frame in a flip-chip manner so that an active surface of the semiconductor chip is attached to the die pad and electrically connected to the leads by the conductive elements interposed between the active surface and the leads, wherein the conductive elements have a collapsed height corresponding to the height difference between the die pad and the leads and are received between the semiconductor chip and the leads; and
    an encapsulant for encapsulating the semiconductor chip and the conductive elements on the lead frame.

7. The flip chip semiconductor package of claim 6, wherein the lead frame is made of a solderable metallic material.

8. The flip chip semiconductor package of claim 6, wherein the die pad has a chip carrying surface applied with a non-conductive thermal adhesive thereon.

9. The flip chip semiconductor package of claim 6, wherein the conductive elements are made of soft metal with a low melting point.

10. The flip chip semiconductor package of claim 6, wherein the conductive elements are solder bumps.

11. A flip chip semiconductor package, comprising:

a lead frame having a die pad and a plurality of leads surrounding the die pad, each of the leads having an inner end directed toward the die pad, wherein the inner end of each of the leads is formed with a recessed contact portion, making the die pad higher in elevation than the leads by a height difference corresponding to a depth of the recessed contact portions of the leads, and wherein the depth of the recessed contact portions is determined according to collapse degree of a plurality of conductive elements and corresponds to a collapsed height of the conductive elements, which electrically connect a semiconductor chip to the leads;

at least one semiconductor chip mounted on the lead frame in a flip-chip manner so that an active surface of the semiconductor chip is attached to the die pad and electrically connected to the leads by the conductive elements interposed between the active surface and the leads, wherein the conductive elements have a collapsed height corresponding to the depth of the recessed contact portions of the leads and are received within the recessed contact portions; and an encapsulant for encapsulating the semiconductor chip and the conductive elements on the lead frame.

12. The flip chip semiconductor package of claim 11, wherein the lead frame is made of a solderable metallic material.

13. The flip chip semiconductor package of claim 11, wherein the conductive elements are made of soft metal with a low melting point.

14. The flip chip semiconductor package of claim 11, wherein the conductive elements are solder bumps.

* * * * *